(12) United States Patent
Koo et al.

(10) Patent No.: US 7,180,236 B2
(45) Date of Patent: Feb. 20, 2007

(54) FLAT PANEL DISPLAY AND FABRICATION METHOD THEREOF

(75) Inventors: Jae Bon Koo, Yongin (KR); Sang-Il Park, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 244 days.

(21) Appl. No.: 10/694,941

(22) Filed: Oct. 29, 2003

(65) Prior Publication Data

US 2004/0169182 A1   Sep. 2, 2004

(30) Foreign Application Priority Data

Nov. 12, 2002   (KR) .................. 10-2002-0070095

(51) Int. Cl.
*H05B 33/00* (2006.01)

(52) U.S. Cl. .................. 313/499; 345/92; 257/59; 257/72

(58) Field of Classification Search ............ 313/498, 313/499; 257/59, 72, 347, 350, 351; 345/92
See application file for complete search history.

(56) References Cited

U.S. PATENT DOCUMENTS

| | | | |
|---|---|---|---|
| 5,318,919 A * | 6/1994 | Noguchi et al. ............ 438/166 |
| 5,744,824 A | 4/1998 | Kousai et al. |
| 6,548,331 B2 | 4/2003 | Lee et al. |
| 6,596,573 B2 | 7/2003 | Lee et al. |
| 6,639,249 B2 | 10/2003 | Valliath |
| 6,692,996 B2 | 2/2004 | Lee et al. |
| 6,709,910 B1 | 3/2004 | Crowder et al. |
| 6,727,121 B2 | 4/2004 | Jou et al. |
| 2001/0028060 A1* | 10/2001 | Yamazaki et al. ............ 257/72 |
| 2002/0074548 A1 | 6/2002 | Lee et al. |
| 2002/0139979 A1 | 10/2002 | Joo et al. |
| 2002/0196389 A1 | 12/2002 | Koyama |
| 2003/0085401 A1 | 5/2003 | Joo et al. |
| 2003/0094613 A1 | 5/2003 | Joo et al. |
| 2003/0102473 A1 | 6/2003 | Chason et al. |
| 2003/0111691 A1* | 6/2003 | So ............................. 257/347 |
| 2003/0113949 A1 | 6/2003 | Valliath |
| 2003/0143794 A1 | 7/2003 | Nakamura et al. |

(Continued)

FOREIGN PATENT DOCUMENTS

CN        1118521 A        3/1996

(Continued)

*Primary Examiner*—Ashok Patel
(74) *Attorney, Agent, or Firm*—H.C. Park & Associates, PLC (57) ABSTRACT

A flat panel display with a plurality of pixels. Each pixel has at least a first transistor and a second transistor and a semiconductor layer of the first transistor has a mobility which is different from a semiconductor layer of the second transistor.

A method for fabricating a flat panel display including at least a first transistor and a second transistor by forming an amorphous silicon film on an insulating substrate and crystallizing the amorphous silicon film into a polysilicon film that is divided into at least a first region having a first mobility and a second region having a second mobility. The method further involves forming a semiconductor layer for the first transistor from the region with the first mobility and the second transistor from the region with the second mobility by patterning the polysilicon film, where the first mobility is different from the second mobility.

22 Claims, 7 Drawing Sheets

U.S. PATENT DOCUMENTS

| | | | |
|---|---|---|---|
| 2003/0234759 A1* | 12/2003 | Bergquist | 345/92 |
| 2004/0046171 A1 | 3/2004 | Lee et al. | |
| 2004/0110329 A1 | 6/2004 | Joo et al. | |
| 2004/0125265 A1 | 7/2004 | Koo et al. | |
| 2004/0130005 A1 | 7/2004 | Guzman et al. | |
| 2004/0142582 A1 | 7/2004 | Crowder et al. | |
| 2004/0144988 A1 | 7/2004 | Jung | |
| 2004/0169182 A1 | 9/2004 | Koo et al. | |

FOREIGN PATENT DOCUMENTS

| | | |
|---|---|---|
| JP | 5232506 | 9/1993 |
| JP | 08-006053 | 1/1996 |
| JP | 09-246183 | 9/1997 |
| JP | 10-229202 | 8/1998 |
| JP | 2001202034 | 7/2001 |

* cited by examiner

FLAT PANEL DISPLAY AND FABRICATION METHOD THEREOF

CROSS REFERENCE TO RELATED APPLICATION

This application claims priority to and the benefit of Korean Patent Application No. 2002-70095 filed on Nov. 12, 2002, the disclosure of which is hereby incorporated by reference in its entirety.

BACKGROUND OF THE INVENTION

1. Field of the invention

The present invention relates to an active matrix flat panel display, and more particularly, to an organic light emitting diode in which mobilities of the switching transistor and the driving transistor are differed from each other so that the organic light emitting diode is capable of controlling the amount of current flowing through an organic electroluminescent device per unit pixel through the driving transistor as maintaining the switching characteristics of switching transistor as they are, and a fabrication method of the organic light emitting diode.

2. Description of Related Art

Although active matrix organic light emitting diodes (AMOLED) that are a flat panel displays gradually require a high-resolution panel, there it has been difficult to fabricate the high-resolution panels due to characteristics of the organic electroluminescent device and the driving transistor for driving the organic electroluminescent device.

For example, in case of a 5" WVGA AMOLED having a pixel size of 45.5 μm×136.5 μm and a resolution of 180 ppi or more, luminance of 50 cd/m2 per unit area is generated, and it is preferable that a proper amount of current flow to the EL (electroluminescent) device per unit pixel to generate the luminance because luminance per unit area is greatly increased when a current flowing to the EL device per unit pixel is at or above a limit value, and the life span of the EL device is significantly shortened accordingly. Therefore, a proper amount of current for generating a certain luminance per unit area flows through the EL device to radiate a pixel, namely, an EL device in a high resolution AMOLED.

Generally, each unit pixel of an active matrix organic light emitting diode includes two transistors, one capacitor and one organic electroluminescent (EL) device, wherein one of the two transistors is generally a switching transistor for transmitting data signals maintains high switching characteristics, and the second of the two transistors is generally a driving transistor for driving the EL device providing driving current appropriate for resolution of display devices to the EL device.

Because the driving transistor and the switching transistor are typically fabricated on the same polysilicon film, switching characteristics of the switching transistor and low current driving characteristics of the driving transistor generally could not be satisfied at the same time. That is, there have been problems because an amount of current flowing to an EL device through the driving transistor is increased and results in excessively high luminance. Thus, when using polysilicon film having a high mobility to manufacture the driving transistor and the switching transistor, the current density per unit area is increased which causes a reduction in the life span of the EL device while the switching transistor has high switching characteristics.

On the other hand, if the driving transistor and the switching transistor are fabricated using amorphous silicon film having a low mobility, proper luminance may be obtained by reducing the amount of current flowing to the EL device through the driving transistor, however, the switching characteristics of the switching transistor are deteriorated.

One method used to limit the amount of current flowing through the driving transistor is to increase the resistance of channel regions by decreasing the ratio (W/L) of width to length of the driving transistor. A method for increasing the resistance of the channel regions is to form a low doping region in a source/drain region of the driving transistor.

The method for decreasing W/L by increasing length has problems in that stripes are formed in the channel regions, and an opening area is reduced during crystallization using methods including ELA (excimer laser annealing) method since the length of channels is increased. The method for reducing W/L by reducing the width of the driving transistor has problems in that it is restricted by the rules of design in the photo process, and it is hard to secure reliability of the transistor. Furthermore, the method for increasing resistance of the channel regions by forming a low doping region in the source/drain region of the driving transistor has problems in that a doping process has to be performed additionally.

SUMMARY OF THE INVENTION

This invention provides an active matrix organic light emitting diode capable of obtaining high switching characteristics of switching transistor as well as low current driving characteristics of a driving transistor by forming the driving transistor and the switching transistor in such a manner that a semiconductor layer of the driving transistor and a semiconductor layer of the switching transistor have a different mobility, and a fabrication method of the active matrix organic light emitting diode.

This invention separately provides an active matrix organic light emitting diode capable of obtaining a proper luminance per unit area by decreasing an amount of current flowing to an electroluminescent device, and a fabrication method of the active matrix organic light emitting diode.

This invention separately provides a flat panel display with a plurality of pixels. Each pixel has at least a first transistor and a second transistor and a semiconductor layer of the first transistor has a mobility which is different from a semiconductor layer of the second transistor.

This invention separately provides a flat panel display comprising a plurality of pixels, each of the pixels including a first transistor and a second transistor, where a semiconductor layer of the first transistor has a crystal structure which is different from a crystal structure of the second transistor.

This invention separately provides a method for fabricating a flat panel display including at least a first transistor and a second transistor by forming an amorphous silicon film on an insulating substrate, crystallizing the amorphous silicon film into a polysilicon film that is divided into at least a first region having a first mobility and a second region having a second mobility, and forming a semiconductor layer for the first transistor from the region with the first mobility and the second transistor from the region with the second mobility by patterning the polysilicon film, where the first mobility is different from the second mobility.

This invention separately provides a method for fabricating a flat panel display including a first transistor and a second transistor by forming an amorphous silicon film on an insulating substrate, crystallizing a part of the amorphous silicon film into a polysilicon film, and forming a first semiconductor layer for the first transistor and a second semiconductor layer for the second transistor by patterning the polysilicon film and the amorphous silicon film, where the first semiconductor layer has a different mobility than the second semiconductor layer.

This invention separately provides a flat panel display having R, G and B unit pixels, wherein at least one unit pixel in the R, G and B unit pixels includes a first transistor and a second transistor. The first transistor has a first semiconductor layer and the second transistor has a second semiconductor layer and a mobility of the first semiconductor layer is different from a mobility of the second semiconductor layer.

This invention separately provides a flat panel display comprising R, G and B unit pixels, wherein at least one unit pixel in R, G and B unit pixels includes at least a first transistor and a second transistor. The first transistor comprises a first semiconductor layer has a different crystal structure than a crystal structure of a second semiconductor layer of the second transistor.

BRIEF DESCRIPTION OF THE DRAWINGS

Further objects and advantages of the invention can be more fully understood from the following detailed description taken in conjunction with the accompanying drawings.

DETAILED DESCRIPTION OF THE INVENTION

The present invention will now be described in detail in connection with exemplary embodiments with reference to the accompanying drawings. For reference, like reference characters designate corresponding parts throughout several views.

Figure 6:
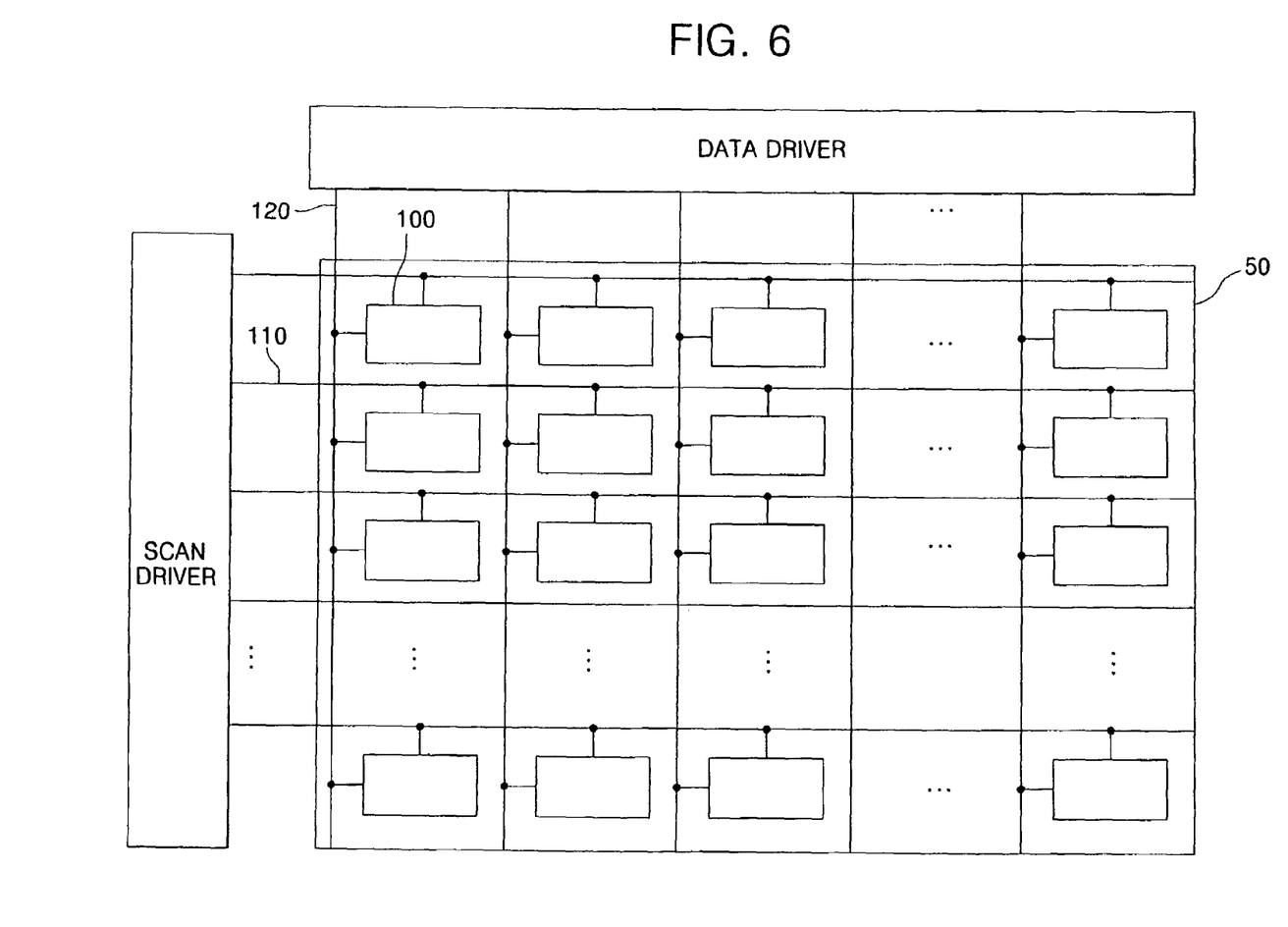
FIG. 6 diagrams a flat panel display including a plurality of unit pixels.

FIG. 6 illustrates a flat panel display 50 that includes a plurality of unit pixels 100, data lines 120, and scan lines 110.

Figure 1:
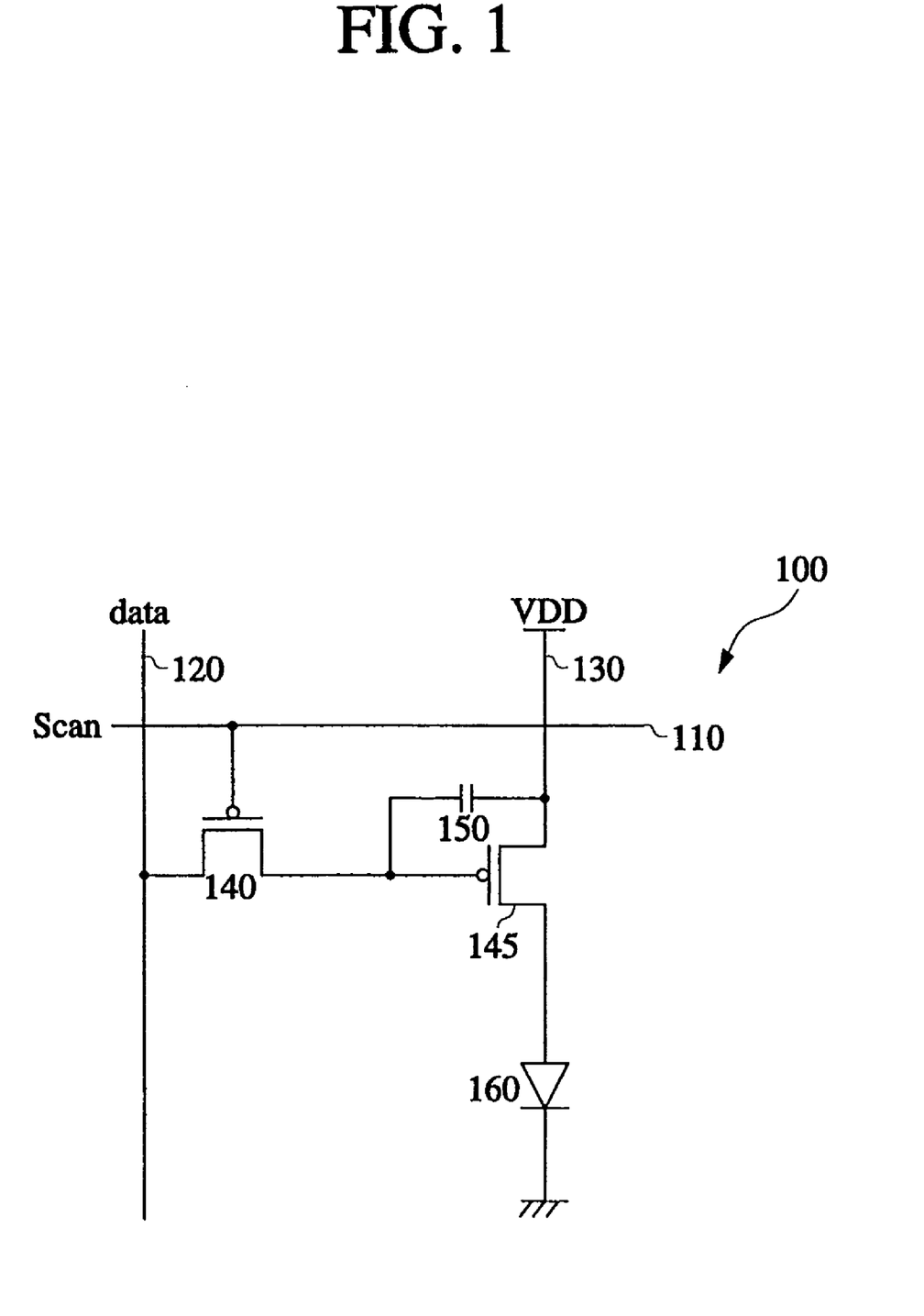
FIG. 1 is an equivalent circuit diagram for a unit pixel in an active matrix organic light emitting diode according to an exemplary embodiment of the present invention.

FIG. 1 illustrates an equivalent circuit diagram for a unit pixel in an active matrix organic light emitting diode according to an exemplary embodiment of the present invention. Referring to FIG. 1, each unit pixel 100 of an active matrix organic light emitting diode of the present invention includes two p type thin film transistors (TFTs), a capacitor 150, and an organic electroluminescent (EL) device 160. One of the p type thin film transistor is called a switching transistor 140 and the other p type thin film transistor is called a driving transistor 145.

The switching transistor 140 is driven by scan signals provided to a gate line 110. Thus, the switching transistor 140 plays a role of transmitting data signals provided to a data line 120. The driving transistor 145 determines an amount of current flowing through the EL device 160 according to the data signals transmitted through the switching transistor 140, namely, by a voltage difference (Vgs) between the gate and the source. The capacitor 150 plays a part in storing the data signals transmitted through the switching transistor 140 during a cycle of frame.

In an exemplary embodiment of the present invention, the switching transistor 140 has a higher mobility than that of the driving transistor 145. For example, the switching transistor is a polysilicon TFT having a large grain size and the driving transistor is a polysilicon TFT having a small grain size or the switching transistor is a polysilicon TFT and the driving transistor is an amorphous silicon TFT.

By using a transistor with a higher mobility as the switching transistor 140 and a transistor with a lower mobility as the driving transistor 145, a proper amount of current can flow through the EL device 160 per unit pixel, and a luminance appropriate for small scale high resolution can be generated while the switching characteristics of the switching transistor 140 are maintained.

Figure 2A:
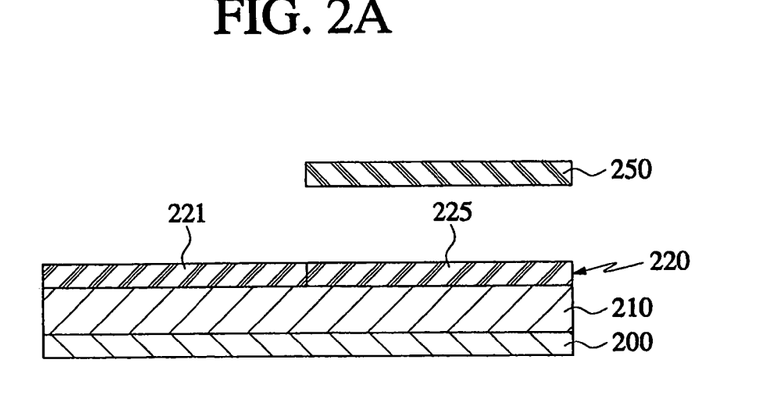
FIGS. 2A, 2B and 2C diagram a method for fabricating an active matrix organic light emitting diode using an SLS crystallization method according to a first exemplary embodiment of the present invention.
Figure 2B:
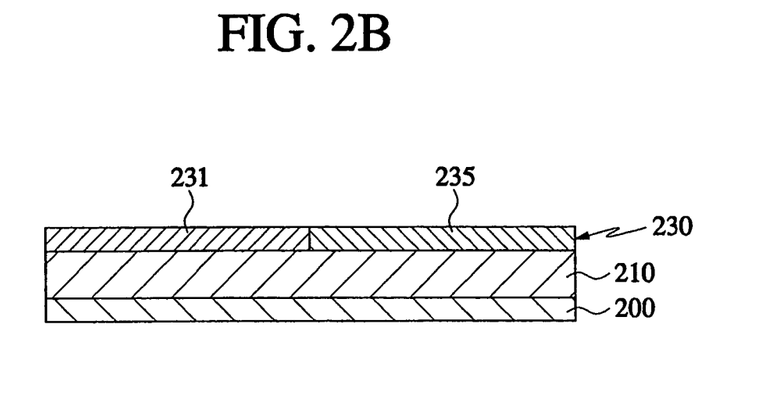
Figure 2C:
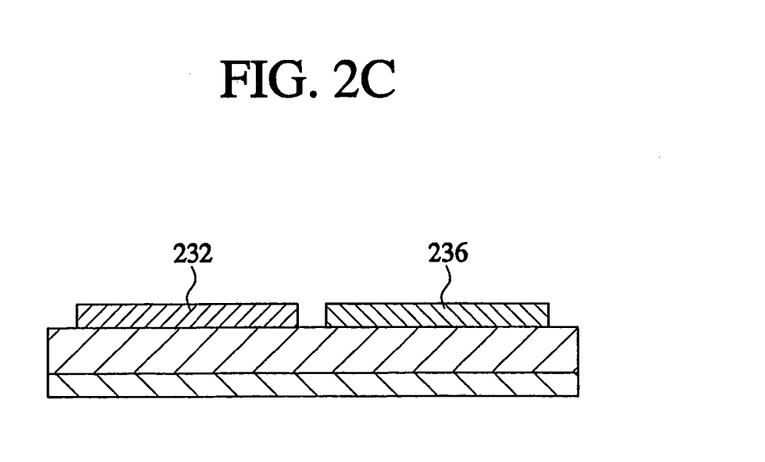

FIGS. 2A, 2B and 2C diagram a method for fabricating an organic light emitting diode using an SLS (sequential lateral solidification) crystallization method according to a first exemplary embodiment of the present invention.

Referring to FIG. 2A, a buffer layer 210 is formed on an insulating substrate 200, and an amorphous silicon film 220 is deposited on the buffer layer 210. A mask 250 for forming a polysilicon film having partially different grain sizes during crystallization of the amorphous silicon film 220 is aligned. The amorphous silicon film 220 has a masked portion 225, which is blocked by the mask 250 and an unmasked portion 221. The masked portion 225 of the amorphous film 220 is where a polysilicon film having small grains is to be formed and the unmasked portion 221 of the amorphous film 220 is a portion where a polysilicon film having large grains is to be formed.

Referring to FIG. 2B, a polysilicon film 230 having partially different grain sizes is formed by crystallizing the amorphous silicon film 220 through an SLS crystallization method using the mask 250. That is, the polysilicon film 230 is comprised of a large grain sized region 231 and a small grain sized region 235. The large grain sized region 231 and the small grain sized region 235 are formed by performing SLS crystallization using a mask 250 with an energy intensity or the energy amount of the laser being varied. It is preferable to control the energy intensity or the energy amount of a laser during the SLS crystallization so that the large grain sized region 231 of the polysilicon film 230 has the grain size 10 times or more large than the small grain sized region 235 of the polysilicon film 230.

Referring to FIG. 2C, first and second semiconductor layers 232 and 236 having different mobilities are formed by patterning the polysilicon film 230 using a mask (not shown on the drawing) for an active layer. The first semiconductor layer 232, which may serve as an activation layer for the switching transistor, is formed in the large grain sized region 231 of the polysilicon film 230 so that the first semiconductor layer 232 has a high mobility suitable for the switching transistor. The second semiconductor layer 236, which may serve as an activation layer for the driving transistor, is formed in the small grain sized region 235 of the polysilicon film 230 so that the second semiconductor layer 236 has a low mobility suitable for the driving transistor.

Although not illustrated on drawings, the switching transistor 140 and the driving transistor 145 are fabricated by an ordinary thin film transistor forming process so as to fabricate an active matrix organic light emitting diode capable of obtaining low current driving characteristics of the driving transistor while maintaining high switching characteristics of the switching transistor.

In the first exemplary embodiment of the present invention, the polysilicon film 230 having different grain sizes is formed by partially controlling the energy intensity or the energy amount of the laser using the mask 250 by the SLS crystallization method to fabricate the semiconductor layer 232 for the switching transistor and the semiconductor layer 236 for the driving transistor having different mobilities.

In the first exemplary embodiment of the invention, a first semiconductor layer for the switching transistor 140 is formed of a polysilicon film and a second semiconductor layer for the driving transistor 145 is formed of an amorphous silicon film. The switching transistor 140 and the driving transistor 145 are fabricated so that the driving transistor and the switching transistor have different mobilities by crystallizing a portion where the semiconductor layer for the switching transistor 140 is to be formed in an amorphous silicon film 220 into a polysilicon film in the state where a laser is completely blocked by mask 250 over a portion where a semiconductor layer for the driving transistor is to be formed in the amorphous silicon film 220.

FIGS. 3A, 3B, 3C and 3D are cross sectional views for explaining a method for fabricating an active matrix organic light emitting diode using an MIC/MILC (metal induced crystallization/metal induced lateral crystallization) crystallization methods according to a second exemplary embodiment of the present invention.

Figure 3A:
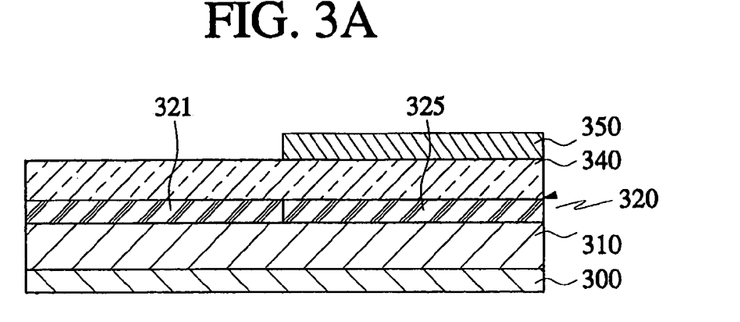
FIGS. 3A, 3B, 3C and 3D diagram a method for fabricating an active matrix organic light emitting diode using an MIC/MILC crystallization method according to a second exemplary embodiment of the present invention.

Referring to FIG. 3A, a buffer layer 310 is formed on an insulating substrate 300, and an amorphous silicon film 320 is formed on the buffer layer 310. Subsequently, an oxide film 340, to be used as a mask for MILC, is formed on the amorphous silicon film 320, and a photosensitive film 350 is formed on the oxide film 340. A portion 325 of the amorphous silicon film corresponding to the photosensitive film 350 is a portion where a semiconductor layer of the switching transistor is to be formed while the remaining portion 321 of the amorphous silicon film 320 is a part where a semiconductor layer of the driving transistor is to be formed.

Figure 3B:
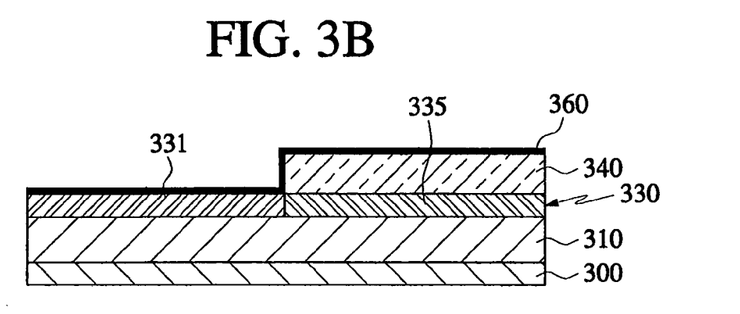

Referring to FIG. 3B, a metallic film 360 to be used as a crystallization catalyst for MILC, e.g., Ni film, is formed on the substrate after patterning the oxide film 340 using the photosensitive film 350. The photosensitive film 350 is then removed. A photosensitive film may be used as a mask for MILC without using of the oxide film 340, however, the oxide film 340 is used as a mask for MILC in the second exemplary embodiment of the invention.

A polysilicon film 330 comprised of a region 331 crystallized by MIC and a region 335 crystallized by MILC is formed by crystallizing the amorphous silicon film 320 using MIC/MILC crystallization methods. A portion 321 of the amorphous silicon film 320 which is in direct contact with the metallic film 360 is crystallized into polysilicon film 331 having a small grain size by MIC crystallization. A portion 325 of the amorphous silicon film 320 which is masked by the oxide film 340 and is not in direct contact with the metallic film 360 is crystallized into a polysilicon film 335 having a large grain size by MILC crystallization.

Figure 3C:
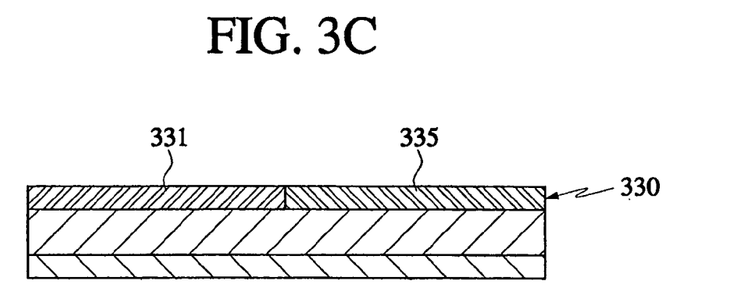
Figure 3D:
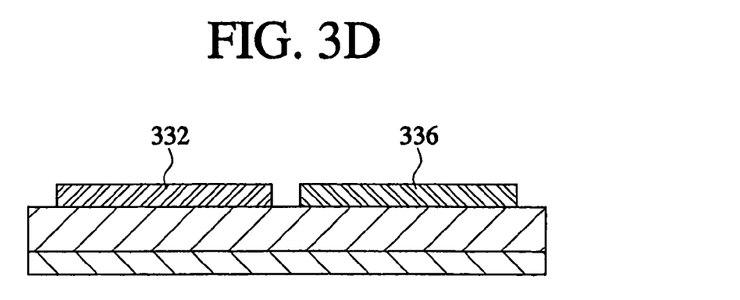

A first semiconductor layer 332 and a second semiconductor layer 336 having different mobilities are formed by patterning, as shown in FIG. 3D, the polysilicon film 330 using a mask for a semiconductor layer (not illustrated on the drawing) after removing the oxide film 340 and the metallic film 360, as shown in FIG. 3C.

The first semiconductor layer 332 functions as an active layer for the driving transistor and has a low mobility suitable for the driving transistor. In particular, the first semiconductor layer 332 is the semiconductor layer 332 which is crystallized by MIC crystallization has a small grain size. The second semiconductor layer 336 functions as an active layer for the switching transistor and has a high mobility suitable for the switching transistor. In particular, the second
semiconductor layer 336 which is crystallized by MILC crystallization has a large grain size.

Although not illustrated in the drawings, the switching transistor and the driving transistor are further fabricated by a process for forming an ordinary thin film transistor. The invention provides a method for forming an active matrix organic light emitting diode with a driving transistor capable of obtaining low current driving characteristics and a switching transistor capable of maintaining high switching characteristics.

Figure 4A:
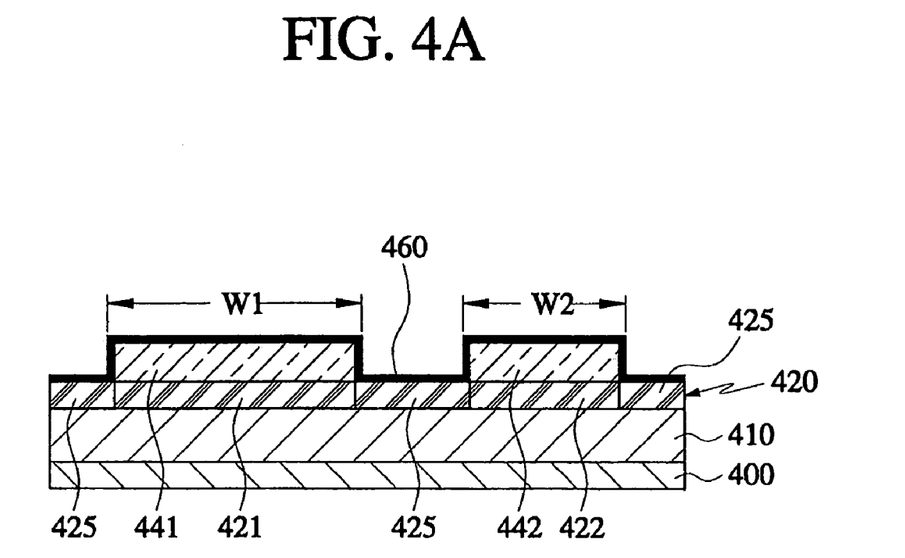
FIGS. 4A and 4B diagrams a method for fabricating an active matrix organic light emitting diode using an MIC/MILC crystallization method according to a third exemplary embodiment of the present invention.
Figure 4B:
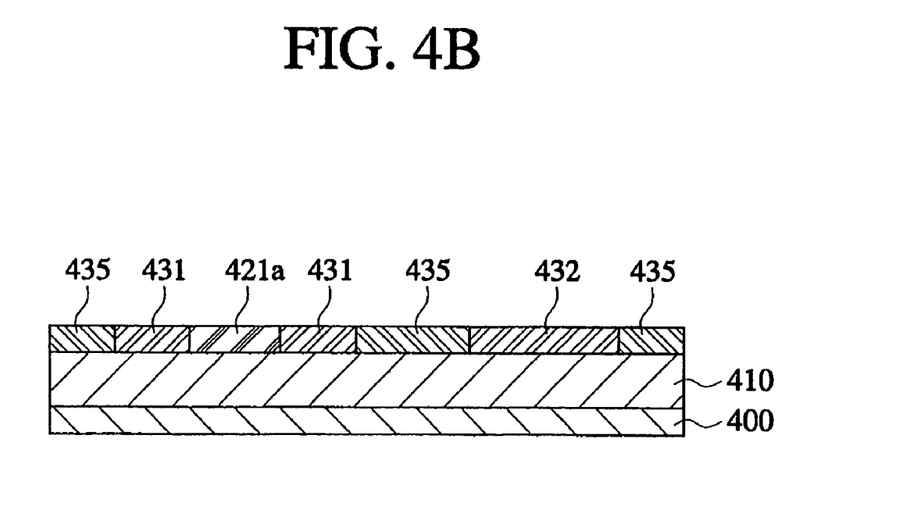

FIGS. 4A and FIG. 4B are cross sectional views explaining a method for fabricating an organic light emitting diode using MIC/MILC crystallization technology according to third exemplary embodiment of the present invention.

Referring to FIG. 4A, a buffer layer 410 is formed on an insulating substrate 400, and an amorphous silicon film 420 is formed on the buffer layer 410. Subsequently, MILC masks 441 and 442 are formed on the amorphous silicon film 420, and a metallic film 460 to be used as a crystallization catalyst for MILC is formed on the substrate. The MILC mask 441 is a mask for forming a semiconductor layer for the driving transistor and the MILC mask 442 is a mask for forming a semiconductor layer for the switching transistor, and the width W1 of the MILC mask 441 is larger than the width W2 of the MILC mask 442.

Referring to FIG. 4B, a polysilicon film that is divided into MIC regions 435 and MILC regions 431 and 432 is formed by performing a MIC/MILC crystallization process, thereby partially crystallizing the amorphous silicon film 420. Portions 425 of the amorphous silicon film 420 which are in direct contact with the metallic film 460 are crystallized by MIC to become the MIC regions 435 and portion 422 of the amorphous silicon film 420 which corresponds to the MILC mask 442 is entirely or substantially entirely crystallized by MILC to become the MILC regions 432, and the portion 421 corresponding to the MILC mask 441 is partially crystallized by MILC to become MILC regions 431. The portion 421 which is partially crystallized by MILC coexists with an amorphous silicon film 421a therebetween.

Subsequently, semiconductor layers of the switching transistor and the driving transistor are formed using a mask for a semiconductor layer (not illustrated on the drawings), wherein the semiconductor layer of the switching transistor is formed of the region 432 crystallized by the MILC in the polysilicon film, and the semiconductor layer of the driving transistor is formed of the MILC regions 431. An amorphous silicon film 421a coexists between the regions 431.

Therefore, the semiconductor layer of the driving transistor is formed on the region 431 crystallized by MILC and the amorphous silicon film 421a coexisting between the regions 431 to fabricate an organic light emitting diode in such a way that the driving transistor and the switching transistor have different mobilities. More particularly, the organic light emitting diode is fabricated by crystallizing the amorphous silicon film with MILC crystallization where the crystallization distance, crystallization time and temperature conditions of the driving transistor and the switching transistor are varied.

FIGS. 5A, 5B, 5C, 5D, 5E, and FIG. 5F illustrate exemplary patterns of the semiconductor layers for the switching transistor and the driving transistor in when forming the semiconductor layer for the switching transistor and the driving transistor with masks of different widths for MILC according to the third exemplary embodiment of the present invention.

Figure 5A:
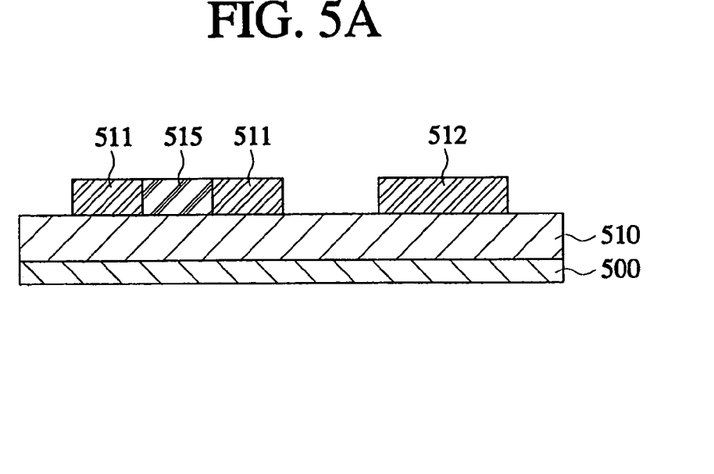
FIGS. 5A, 5B, 5C, 5D, 5E and 5F diagram exemplary patterns of semiconductor layers for a switching transistor and a driving transistor in a method for fabricating an active matrix organic light emitting diode using an MIC/MILC crystallization method according to the third exemplary embodiment of the present invention.
Figure 5B:
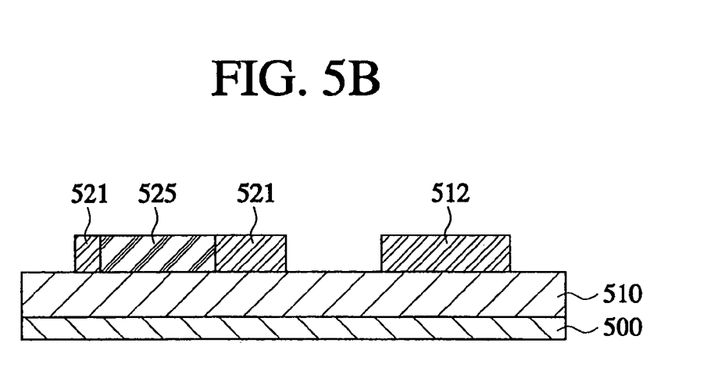
Figure 5C:
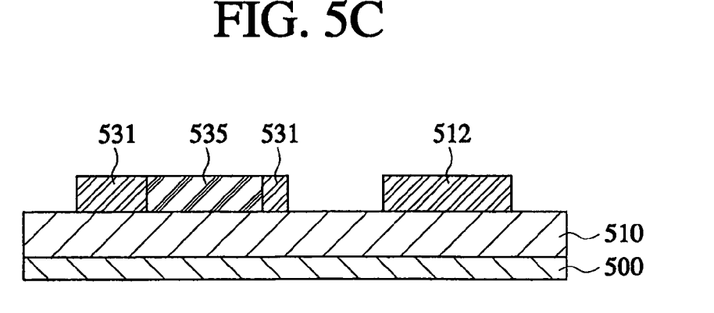
Figure 5D:
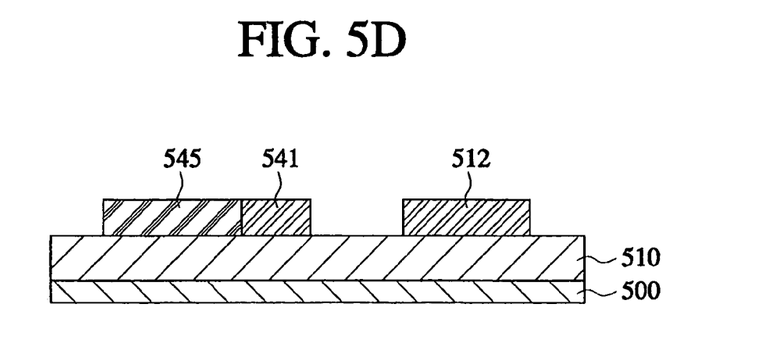
Figure 5E:
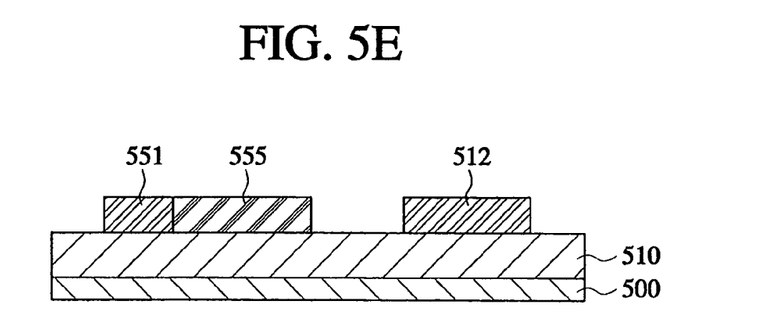
Figure 5F:
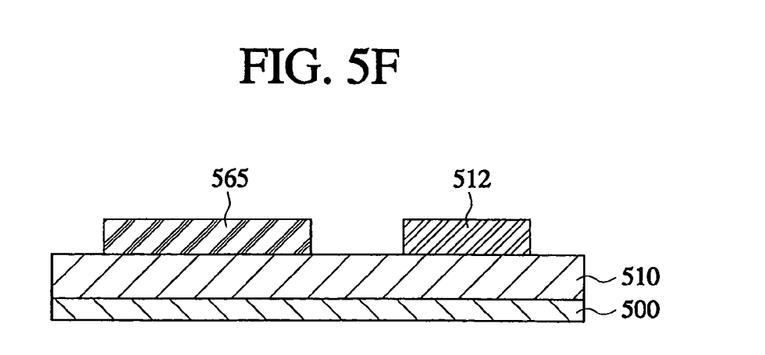

The semiconductor layer of the switching transistor is formed of a polysilicon film 512 crystallized by MILC as illustrated in FIGS. 5A, 5B, 5C, 5D, %e and 5F, while the semiconductor layer of the driving transistor is formed of a MILC region 511 and an amorphous silicon film 515 between the MILC regions 511 so that it is symmetrically formed as illustrated in FIG. 5A. However, as shown in FIG. 5B and FIG. 5C, the semiconductor layer of the driving transistor may be formed of MILC regions 521 and 531 and amorphous silicon films 525 and 535 between the MILC regions 521 and 531, respectively so that they are asymmetrically formed. Further, as shown in FIG. 5D and FIG. 5E, the semiconductor layer of the driving transistor can be patterned so that it is formed of amorphous silicon films 545 and 555 and MILC regions 541 and 551 respectively. Further, as shown in FIG. 5F, the semiconductor layer of the driving transistor can be patterned so that it is formed only of an amorphous silicon film 565.

Although first, second and third exemplary embodiments of the present invention are explained with regard to a unit pixel, the first, second and third exemplary embodiments of the present invention can be applied to all unit pixels R, G and B or, for example, to a concerned pixel only in the unit pixels R, G and B.

As described in the above, an organic light emitting diode according to exemplary embodiments of the present invention is capable of generating luminance which is appropriate for a small scale high resolution flat panel display and extending the life cycle of the device by forming a switching transistor with high mobility characteristics and low leakage current characteristics of a polysilicon film to maintain high switching characteristics of the switching transistor and forming a driving transistor with a polysilicon film or amorphous silicon film having a low mobility to control the current flowing through an EL device through the driving transistor.

Furthermore, an organic light emitting diode according to exemplary embodiments of the present invention has merits in that it solves reduction problems of opening ratio and improves reliability by controlling an amount of current flowing to an EL device.

Furthermore, an organic light emitting diode according to exemplary embodiments of the present invention provides a high frequency transistor having a high mobility required in circuit mounting and a transistor having a low mobility for reducing an amount of current flowing to the EL device, which are integrated for the same panel by partially varying crystallization characteristics.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. A flat panel display comprising a plurality of pixels, each pixel including at least a first transistor and a second transistor, wherein a semiconductor layer of the first transistor has a mobility which is different from a semiconductor layer of the second transistor.

2. The flat panel display according to claim 1, wherein the semiconductor layer of the first transistor has different grain size than the semiconductor layer of the second transistor.

3. The flat panel display according to claim 1, wherein the semiconductor layer of
the first transistor has a lower mobility than the semiconductor layer of the second transistor.

4. The flat panel display according to claim 3, wherein the semiconductor layer of the first transistor has a grain size that is about 10 times or more smaller than the semiconductor layer of the second transistor.

5. The flat panel display according to claim 1, wherein each of the pixels further comprises a luminescent device, the first transistor is a driving transistor and the second transistor is a switching transistor, wherein the switching transistor transmits data signals according to scan signals and the driving transistor drives the luminescent device so that an amount of current corresponding to the data signals is flown through the luminescent device, and the mobility of the semiconductor layer of the driving transistor is lower than the mobility of the semiconductor layer of the switching transistor.

6. The flat panel display according to claim 1, wherein the semiconductor layer of the first transistor comprises an amorphous silicon film, and the semiconductor layer of the second transistor is comprised of a polysilicon film.

7. The flat panel display according to claim 6, wherein the semiconductor layer of the first transistor further comprises polysilicon film, and the polysilicon film included in the semiconductor layer of the first transistor is a MILC (metal induced lateral crystallization) region.

8. The flat panel display according to claim 1, wherein the semiconductor layer of the first transistor includes a MJLC (metal induced lateral crystallization) region and the semiconductor layer of the second transistor includes a MIC (metal induced crystallization) region.

9. A flat panel display comprising a plurality of pixels, each of the pixels including a first transistor and a second transistor, wherein a semiconductor layer of the first transistor has a crystal structure which is different from a crystal structure of the second transistor.

10. The flat panel display according to claim 9, wherein each of the pixels further comprises a luminescent device, the first transistor being is a driving transistor for driving the luminescent device and the second transistor is a switching transistor, wherein the switching transistor transmits data signals according to scan signals and the driving transistor for drives the luminescent device so that a certain amount of current is flown through the luminescent device according to the data signals, and the semiconductor layer of the driving transistor is comprised of a polysilicon film having smaller grains than grains of the semiconductor layer of the switching transistor.

11. The flat panel display according to claim 10, wherein the semiconductor layer of the driving transistor has a grain size that is about 10 times or more smaller compared with the semiconductor layer of the switching transistor.

12. The flat panel display according to claim 9, wherein the semiconductor layer of the first transistor comprises an amorphous silicon film, and a semiconductor layer of the second 10 transistor is comprised of a polysilicon film.

13. The flat panel display according to claim 12, wherein the semiconductor layer of the first transistor further comprises polysilicon film, and the polysilicon film included in the semiconductor layer is a MILC region.

14. The flat panel display according to claim 9, wherein a semiconductor layer of the first transistor includes a MILC region, and a semiconductor layer of the second transistor includes the MIC region.

15. A flat panel display comprising R, G and B unit pixels, wherein at least one unit pixel in the R, G and B unit pixels includes a first transistor and a second transistor, where the first transistor having a first semiconductor layer and the second transistor having a second semiconductor layer and a mobility of the first semiconductor layer is different from a mobility of the second semiconductor layer.

16. The flat panel display according to claim 15, wherein the first semiconductor layer is comprised of an amorphous silicon film, and the second semiconductor layer comprises a polysilicon film.

17. The flat panel display according to claim 15, wherein the first semiconductor layer is comprises of a polysilicon film crystallized by MILC (metal induced lateral crystallization) and the second semiconductor layer comprises a polysilicon film crystallized by MIC (metal induced crystallization).

18. The flat panel display according to claim 15, wherein the first semiconductor layer and the second semiconductor layer are comprised of a polysilicon film crystallized by a sequential lateral solidification (SLS) crystallization method so that of the first semiconductor layer has a crystal grain size that is about 10 times or more smaller than a crystal grain size of the second semiconductor layer, and the first semiconductor layer has a lower mobility than the second semiconductor layer.

19. A flat panel display comprising R, G and B unit pixels, wherein at least one unit pixel in R, G and B unit pixels includes at least a first transistor and a second transistor, wherein the first transistor comprises a first semiconductor layer having a different crystal structure than a crystal structure of a second semiconductor layer of the second transistor.

20. The flat panel display according to claim 19, wherein the first semiconductor layer comprises an amorphous silicon film, and the second semiconductor layer comprises a polysilicon film.

21. The flat panel display according to claim 19, wherein the second semiconductor layer comprises a polysilicon film crystallized by MIC (metal induced crystallization), and the first semiconductor layer comprises a polysilicon film crystallized by MILC.

22. The flat panel display according to claim 19, wherein the first semiconductor layer and the second semiconductor layer are comprised of a polysilicon film crystallized by a sequential lateral solidification (SLS) crystallization method so that a the first semiconductor layer has a grain size that is about 10 times smaller than a grain size of the second semiconductor layer and the first semiconductor layer has a mobility that is lower than a mobility of the second semiconductor layer.

* * * * *